United States Patent
Wei

(10) Patent No.: US 10,868,395 B2
(45) Date of Patent: Dec. 15, 2020

(54) ETHERNET TRANSMISSION LINE

(71) Applicant: Askey Computer Corp., New Taipei (TW)

(72) Inventor: Chung-Min Wei, New Taipei (TW)

(73) Assignee: ASKEY COMPUTER CORP., New Taipei (TW)

( * ) Notice: Subject to any disclaimer, the term of this patent is extended or adjusted under 35 U.S.C. 154(b) by 0 days.

(21) Appl. No.: 16/747,809

(22) Filed: Jan. 21, 2020

(65) Prior Publication Data

US 2020/0251863 A1 Aug. 6, 2020

(30) Foreign Application Priority Data

Feb. 1, 2019 (CN) .......................... 2019 1 0104940

(51) Int. Cl.
*H01R 24/64* (2011.01)
*H01B 7/06* (2006.01)
*H01R 12/79* (2011.01)
*H01R 13/24* (2006.01)
*H01R 13/52* (2006.01)
*H05K 1/18* (2006.01)

(52) U.S. Cl.
CPC .............. *H01R 24/64* (2013.01); *H01B 7/06* (2013.01); *H01R 12/79* (2013.01); *H01R 13/24* (2013.01); *H01R 13/52* (2013.01); *H05K 1/189* (2013.01)

(58) Field of Classification Search
CPC ...... H01R 12/62; H01R 12/79; H01R 12/592; H05K 1/89; H05K 1/0277; H05K 1/028; H05K 1/0303; H05K 1/118; H05K 3/365; H05K 3/326

USPC ............................ 439/67, 77, 492; 174/117 F
See application file for complete search history.

(56) References Cited

U.S. PATENT DOCUMENTS 8,961,239 B2 * 2/2015 Moffitt ............... H01R 13/6469
439/676
9,608,393 B2 * 3/2017 Shirakawa ........... H01R 12/592
(Continued)

FOREIGN PATENT DOCUMENTS

JP H02112184 A 4/1990
JP 2889471 B2 5/1999

OTHER PUBLICATIONS

EESR issued in corresponding European patent application (No. 20153063) on Jun. 26, 2020.

*Primary Examiner* — Gary F Paumen
(74) *Attorney, Agent, or Firm* — McClure, Qualey & Rodack, LLP

(57) ABSTRACT

An Ethernet transmission line includes two RJ45 connectors and a thin connection line. Each RJ45 connector has a connection terminal group, and the connection terminal group includes a first terminal, a second terminal, a third terminal, a fourth terminal, a fifth terminal, a sixth terminal, a seventh terminal, and an eighth terminal that are sequentially arranged. The thin connection line is connected between the two RJ45 connectors and the thin connection line includes a first flexible printed circuit board layer, a second flexible printed circuit board layer, and a spacing layer. The first flexible printed circuit board layer is provided with two first transmission lines respectively electrically connected to the third terminal and the sixth terminal. The second flexible printed circuit board layer is provided with two second transmission lines respectively electrically connected to the fourth terminal and the fifth terminal.

10 Claims, 7 Drawing Sheets

(56) References Cited

U.S. PATENT DOCUMENTS

| | | | |
|---|---|---|---|
| 2005/0202697 A1* | 9/2005 | Caveney | H01R 13/6461 |
| | | | 439/77 |
| 2007/0190863 A1* | 8/2007 | Caveney | H01R 13/7195 |
| | | | 439/676 |
| 2009/0050354 A1 | 2/2009 | Lee et al. | |
| 2010/0041274 A1* | 2/2010 | Marti | H01R 13/6594 |
| | | | 439/607.01 |
| 2010/0062644 A1* | 3/2010 | Aekins | H01R 13/6473 |
| | | | 439/620.21 |
| 2016/0135285 A1 | 5/2016 | Kim et al. | |
| 2016/0197425 A1 | 7/2016 | Shirakawa et al. | |
| 2016/0268740 A1* | 9/2016 | Schumacher | H05K 1/025 |
| 2017/0257938 A1* | 9/2017 | Komiyama | H05K 1/028 |
| 2018/0159276 A1* | 6/2018 | Schumacher | H05K 1/025 |

* cited by examiner

ETHERNET TRANSMISSION LINE

CROSS-REFERENCE TO RELATED APPLICATION

This non-provisional application claims priority under 35 U.S.C. § 119(a) to Patent Application No. 201910104940.8 filed in China, P.R.C. on Feb. 1, 2019, the entire contents of which are hereby incorporated by reference.

BACKGROUND

Technical Field

The instant disclosure relates to a transmission line, and in particular, to an Ethernet transmission line.

Related Art

With maturation and popularization of communication technologies, networking has become an indispensable part of most public institutions, families, and individuals. In general, most people install network sharing devices indoors, so that a plurality of communications devices (for example, notebook computers, smart phones, or tablet computers) in a specific range can be wiredly or wirelessly connected to the network sharing devices, to access the Internet via the network sharing devices.

An Ethernet is a major wired transmission manner in a computer network.

However, diameters or thicknesses of currently known Ethernet lines are too large (most Ethernet lines exceed 1.5 mm). In particular, Ethernet lines of twisted pair cables are intertwined with each other using a plurality of twisted pair cables. In addition to a conductive circuit (such as a copper line), each twisted cable has an insulation layer outside the conductive circuit, and the plurality of twisted pair cables is covered by a protective cover, and therefore the diameters or the thicknesses of the Ethernet lines cannot be further reduced. Consequently, if the Ethernet line needs to be connected to an outdoor machine, additional construction (for example, damaging doors or windows or drilling holes on walls) is required for a wiring operation, resulting in an increase in costs and affecting aesthetics due to damage to interior decoration.

SUMMARY

In view of the above, in an embodiment, an Ethernet transmission line is provided, including two RJ45 connectors and a thin connection line. Each RJ45 connector has a connection terminal group including a first terminal, a second terminal, a third terminal, a fourth terminal, a fifth terminal, a sixth terminal, a seventh terminal, and an eighth terminal that are sequentially arranged. The first terminal and the second terminal are a first pair of differential terminals, the third terminal and the sixth terminal are a second pair of differential terminals, the fourth terminal and the fifth terminal are a third pair of differential terminals, and the seventh terminal and the eighth terminal are a fourth pair of differential terminals. The thin connection line is connected between the two RJ45 connectors, and the thin connection line includes a first flexible printed circuit board layer, a second flexible printed circuit board layer, and a spacing layer. The spacing layer is sandwiched between the first flexible printed circuit board layer and the second flexible printed circuit board layer. The first flexible printed circuit board layer is provided with two first transmission lines, the two first transmission lines being respectively electrically connected to the third terminal and the sixth terminal that correspond to each connection terminal group. The second flexible printed circuit board layer is provided with two second transmission lines, the two second transmission lines being respectively electrically connected to the fourth terminal and the fifth terminal that correspond to each connection terminal group.

In conclusion, according to the Ethernet transmission line in this embodiment of the instant disclosure, the thin connection line between the two RJ45 connectors is implemented by a flexible printed circuit board. Therefore, a thickness of the thin connection line can be greatly reduced and the thin connection line can have good flexibility, so that the Ethernet transmission line can easily pass through a gap or be installed in a narrow location when being used for indoor connection. When being used for connection to an outdoor device, the Ethernet transmission line can pass through doors or windows directly without affecting opening and closing of the doors or the windows, thereby reducing costs and maintaining aesthetics of interior decoration without additional construction (for example, damaging the doors or the windows or drilling holes on walls).

In addition, the thin connection line is respectively disposed on the first flexible printed circuit board layer and the second flexible printed circuit board layer using the two first transmission lines and the two second transmission lines, so that the two first transmission lines and the two second transmission lines can be separated by the spacing layer, thereby greatly reducing crosstalk between each other. In comparison to a traditional twisted pair cable, it is easier to control a same length for all transmission lines, thereby reducing a transmission delay.

DETAILED DESCRIPTION

Figure 1:
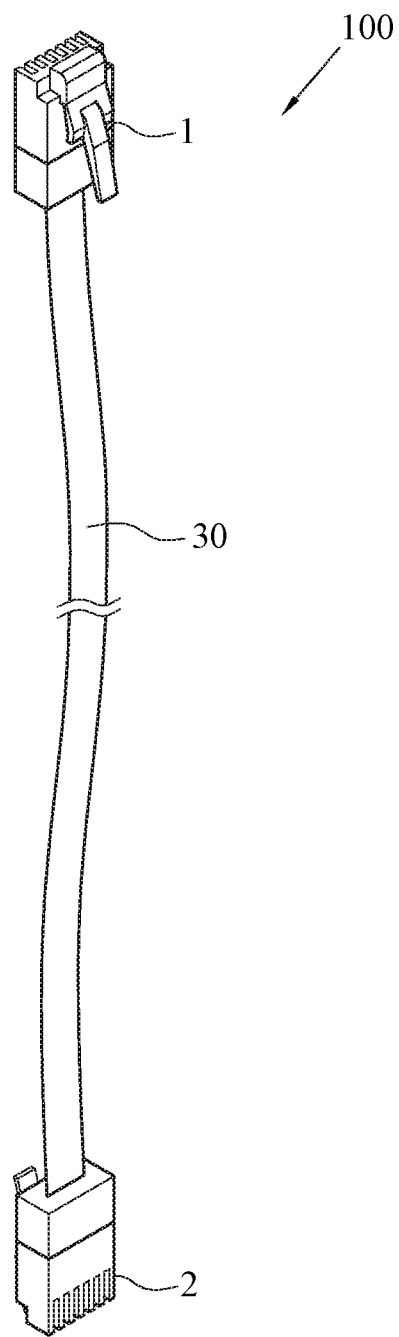
FIG. 1 illustrates a three-dimensional view of an embodiment of an Ethernet transmission line of the instant disclosure.
Figure 2:
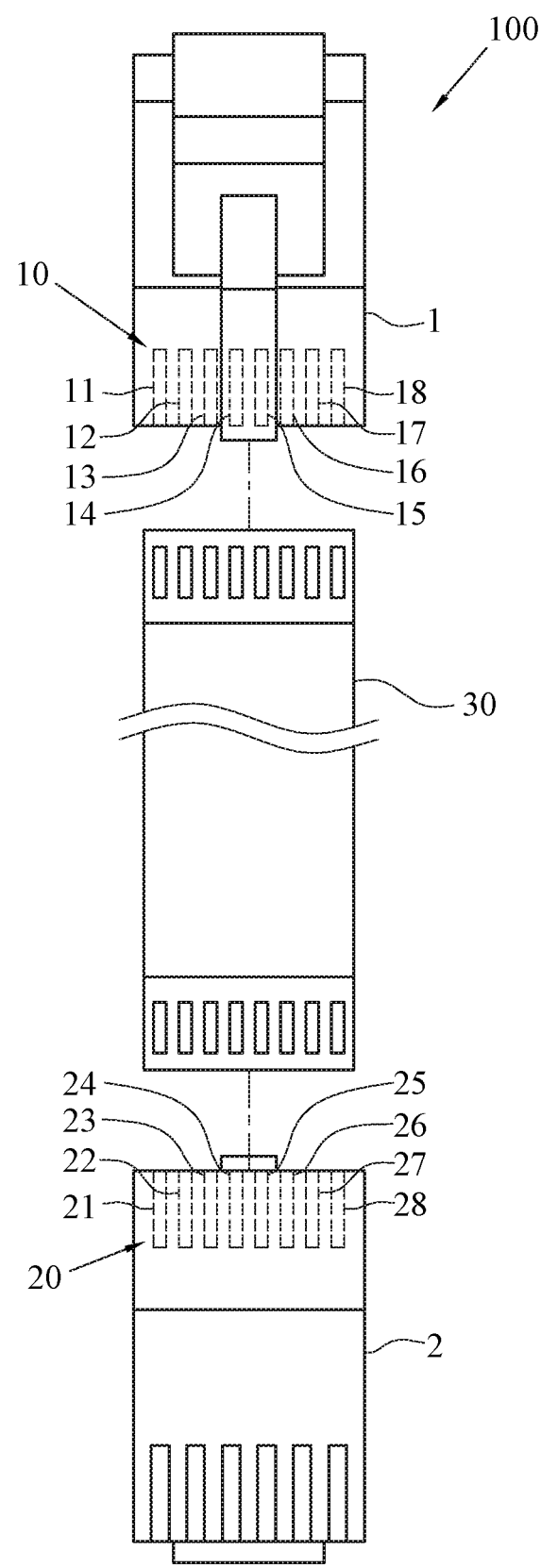
FIG. 2 illustrates a schematic connection diagram of an embodiment of an Ethernet transmission line of the instant disclosure.

As shown in FIG. 1, an Ethernet transmission line 100 includes two RJ45 connectors and a thin connection line 30, the thin connection line 30 being connected between the two RJ45 connectors (hereinafter referred to as a first RJ45 connector 1 and a second RJ45 connector 2). As shown in FIG. 2, the first RJ45 connector 1 and the second RJ45 connector 2 each have connection terminal groups 10, 20. The connection terminal group 10 of the first RJ45 connector 1 includes a first terminal 11, a second terminal 12, a third terminal 13, a fourth terminal 14, a fifth terminal 15, a sixth terminal 16, a seventh terminal 17, and an eighth terminal 18 that are sequentially arranged. The connection terminal group 20 of the second RJ45 connector 2 includes a first terminal 21, a second terminal 22, a third terminal 23, a fourth terminal 24, a fifth terminal 25, a sixth terminal 26, a seventh terminal 27, and an eighth terminal 28 that are sequentially arranged. In some embodiments, a direction in which the first terminal 11 to the eighth terminal 18 in the connection terminal group 10 of the first RJ45 connector 1 are arranged may be the same as a direction in which the first terminal 21 to the eighth terminal 28 in the connection terminal group 20 of the second RJ45 connector 2 are arranged, so that the first terminal 11 to the eighth terminal 18 respectively correspond to the first terminal 21 to the eighth terminal 28.

Figure 3:
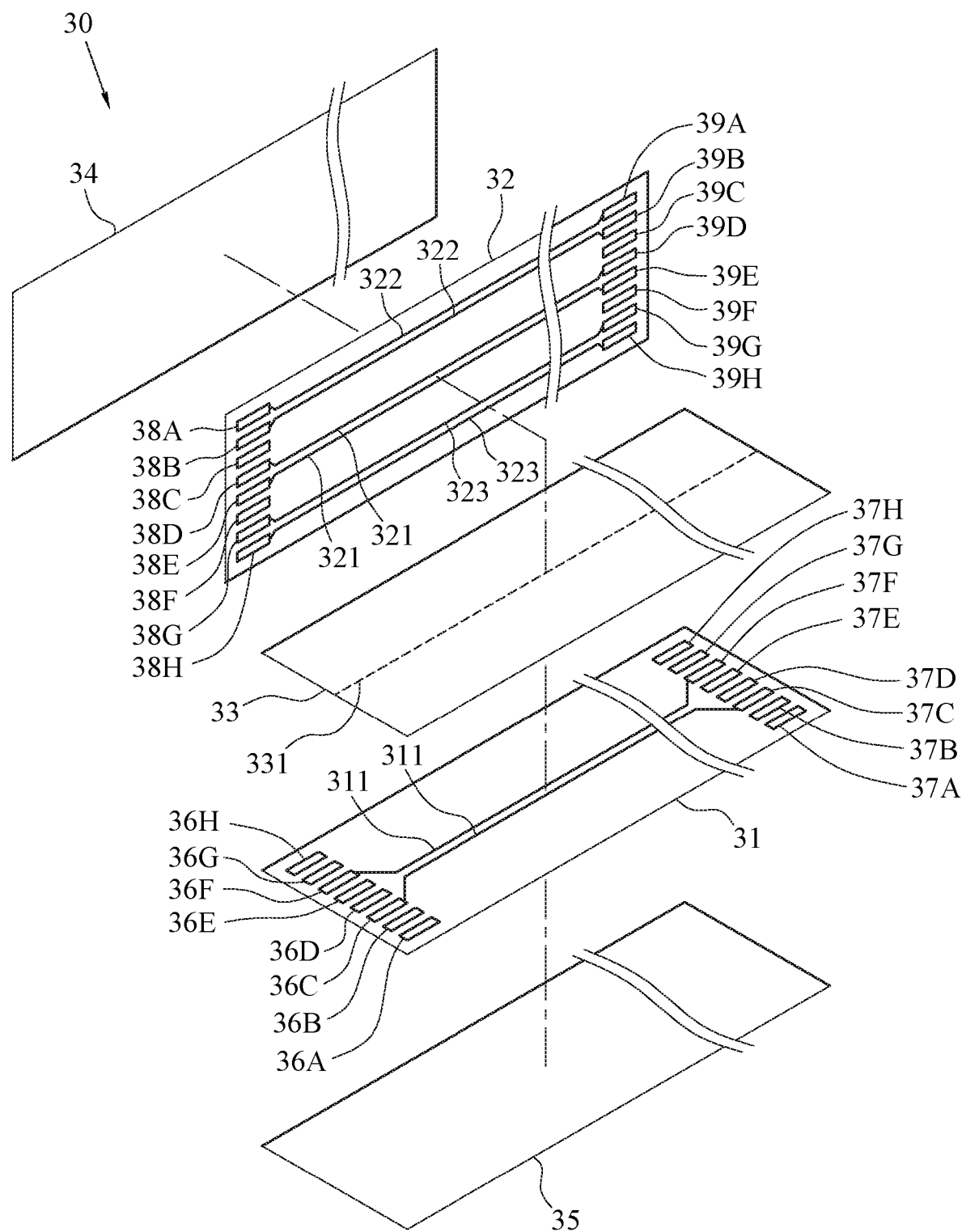
FIG. 3 illustrates a three-dimensional exploded view of an embodiment of an Ethernet transmission line of the instant disclosure.

Then, as shown in FIG. 2 and FIG. 3, for each of the connection terminal groups 10, 20, the first terminal 11 or 21 and the second terminal 12 or 22 are a first pair of differential terminals (Data Pair A+terminal and Data Pair A−terminal), the third terminal 13 or 23 and the sixth terminal 16 or 26 are a second pair of differential terminals (Data Pair B+terminal and Data Pair B−terminal), the fourth terminal 14 or 24 and the fifth terminal 15 or 25 are a third pair of differential terminals (Data Pair C+terminal and Data Pair C−terminal), and the seventh terminal 17 or 27 and the eighth terminal 18 or 28 are a fourth pair of differential terminals (Data Pair D+terminal and Data Pair D−terminal). That is, for the connection terminal group 10, the first pair of differential terminals (the first terminal 11 and the second terminal 12) and the fourth pair of differential terminals (the seventh terminal 17 and the eighth terminal 18) are respectively located at two opposite ends of the connection terminal group 10, and the third pair of differential terminals (the fourth terminal 14 and the fifth terminal 15) are located between the second pair of differential terminals (the third terminal 13 and the sixth terminal 16).

Referring to FIG. 2 and FIG. 3, the thin connection line 30 is a multilayer thin film structure. In this embodiment, the thin connection line 30 includes a first flexible printed circuit board layer 31 (FPC layer), a second flexible printed circuit board layer 32 (FPC layer), and a spacing layer 33, the spacing layer 33 being sandwiched between the first flexible printed circuit board layer 31 and the second flexible printed circuit board layer 32. In some embodiments, the first flexible printed circuit board layer 31, the second flexible printed circuit board layer 32, and the spacing layer 33 are all flexible thin film layers, for example, the first flexible printed circuit board layer 31, the second flexible printed circuit board layer 32, and the spacing layer 33 may be thin films made of polyimide, polyethylene terephthalate, polycarbonate, or other plastic materials.

Then, as shown in FIG. 2 and FIG. 3, in this embodiment, a surface of the first flexible printed circuit board layer 31 is provided with two first transmission lines 311. Herein, the two first transmission lines 311 are disposed on an inner surface that is of the first flexible printed circuit board layer 31 and that is close to the spacing layer 33, to prevent exposure and achieve a protective effect. However, the two first transmission lines 311 may be alternatively disposed on an outer surface of the first flexible printed circuit board layer 31. In addition, the two first transmission lines 311 are parallel to each other and are respectively electrically connected to the third terminal 13 or 23 and the sixth terminal 16 or 26 that correspond to each of the connection terminal groups 10, 20 of the first RJ45 connector 1 and the second RJ45 connector 2. That is, ends of the two first transmission lines 311 are electrically connected to the third terminal 13 and the sixth terminal 16 in the connection terminal group 10, and the other ends of the two first transmission lines 311 are electrically connected to the third terminal 23 and the sixth terminal 26 in the connection terminal group 20.

For example, as shown in FIG. 2 and FIG. 3, each of two ends of the first flexible printed circuit board layer 31 may be provided with one group of electrical contacts, to respectively correspond to the connection terminal groups 10, 20 electrically connected to the first RJ45 connector 1 and the second RJ45 connector 2. For example, one end of the first flexible printed circuit board layer 31 has eight electrical contacts 36A to 36H, to respectively correspond to the first terminal 11 to the eighth terminal 18 of the first RJ45 connector 1, and the other end of the first flexible printed circuit board layer 31 also has eight electrical contacts 37A to 37H, to respectively correspond to the first terminal 21 to the eighth terminal 28 of the second RJ45 connector 2. The ends of the two first transmission lines 311 may be respectively electrically connected to the electrical contacts 36C, 36F, and the other ends of the two first transmission lines 311 may be respectively electrically connected to the electrical contacts 37C, 37F, to be electrically connected to the third terminal 13 and the sixth terminal 16 via the electrical contacts 36C, 36F and to be electrically connected to the third terminal 23 and the sixth terminal 26 via the electrical contacts 37C, 37F.

As shown in FIG. 2 and FIG. 3, in this embodiment, a surface of the second flexible printed circuit board layer 32 is provided with two second transmission lines 321 parallel to each other, two third transmission lines 322 parallel to each other, and two fourth transmission lines 323 parallel to each other. Herein, the two second transmission lines 321, the two third transmission lines 322, and the two fourth transmission lines 323 are disposed on an inner surface that is of the second flexible printed circuit board layer 32 and that is close to the spacing layer 33, to prevent exposure and achieve a protective effect. However, the two second transmission lines 321, the two third transmission lines 322, and the two fourth transmission lines 323 may be alternatively disposed on an outer surface of the second flexible printed circuit board layer 32. In addition, the two second transmission lines 321 are electrically connected to the fourth terminal 14 or 24 and the fifth terminal 15 or 25 corresponding to each connection terminal group 10 or 20, the two third transmission lines 322 are electrically connected to the first terminal 11 or 21 and the second terminal 12 or 22 corresponding to each connection terminal group 10 or 20, and the two fourth transmission lines 323 are electrically connected to the seventh terminal 17 or 27 and the eighth terminal 18 or 28 corresponding to each connection terminal group 10 or 20.

For example, as shown in FIG. 2 and FIG. 3, each of two ends of the second flexible printed circuit board layer 32 may be provided with one group of electrical contacts, to respectively correspond to the connection terminal groups 10, 20 electrically connected to the first RJ45 connector 1 and the second RJ45 connector 2. For example, one end of the second flexible printed circuit board layer 32 has eight electrical contacts 38A to 38H, to respectively correspond to the first terminal 11 to the eighth terminal 18 electrically connected to the first RJ45 connector 1, and the other end of the second flexible printed circuit board layer 32 has eight electrical contacts 39A to 39H, to respectively correspond to the first terminals 21 to the eighth terminal 28 electrically connected to the second RJ45 connector 2. Ends of the two third transmission lines 322 may be respectively electrically connected to the electrical contacts 38A, 38B, and the other ends of the two third transmission lines 322 may be respectively electrically connected to the electrical contacts 39A, 39B, to be respectively electrically connected, via the electrical contacts 38A, 38B and the electrical contacts 39A, 39B, to the first terminals 11, 21 and the second terminals 12, 22 that correspond to the connection terminal groups 10, 20. Ends of the two second transmission lines 321 may be respectively electrically connected to the electrical contacts 38D, 38E, and the other ends of the two second transmission lines 321 may be respectively electrically connected to the electrical contacts 39D, 39E, to be respectively electrically connected, via the electrical contacts 38D, 38E and the electrical contacts 39D, 39E, to the fourth terminals 14, 24 and the fifth terminals 15, 25 that correspond to the connection terminal groups 10, 20. Ends of the two fourth transmission lines 323 may be respectively electrically connected to the electrical contacts 38G, 38H, and the other ends of the two fourth transmission lines 323 may be respectively electrically connected to the electrical contacts 39G, 39H, to be respectively electrically connected, via the electrical contacts 38G, 38H and the electrical contacts 39G, 39H, to the seventh terminals 17, 27 and the eighth terminals 18, 28 that correspond to the connection terminal groups 10, 20.

In some embodiments, the two first transmission lines 311, the two second transmission lines 321, the two third transmission lines 322, and the two fourth transmission lines 323 may be conductive lines, such as copper lines, silver paste lines, or other metal lines, but are not limited to metal materials, and any conductive material can be used as a material of the transmission line. In some embodiments, the two first transmission line 311 may be formed on the surface of the first flexible printed circuit board layer 31 through printing or etching, and the two second transmission lines 321, the two third transmission lines 322, and the two fourth transmission lines 323 may also be formed on the surface of the second flexible printed circuit board layer 32 through printing or etching.

Figure 4:
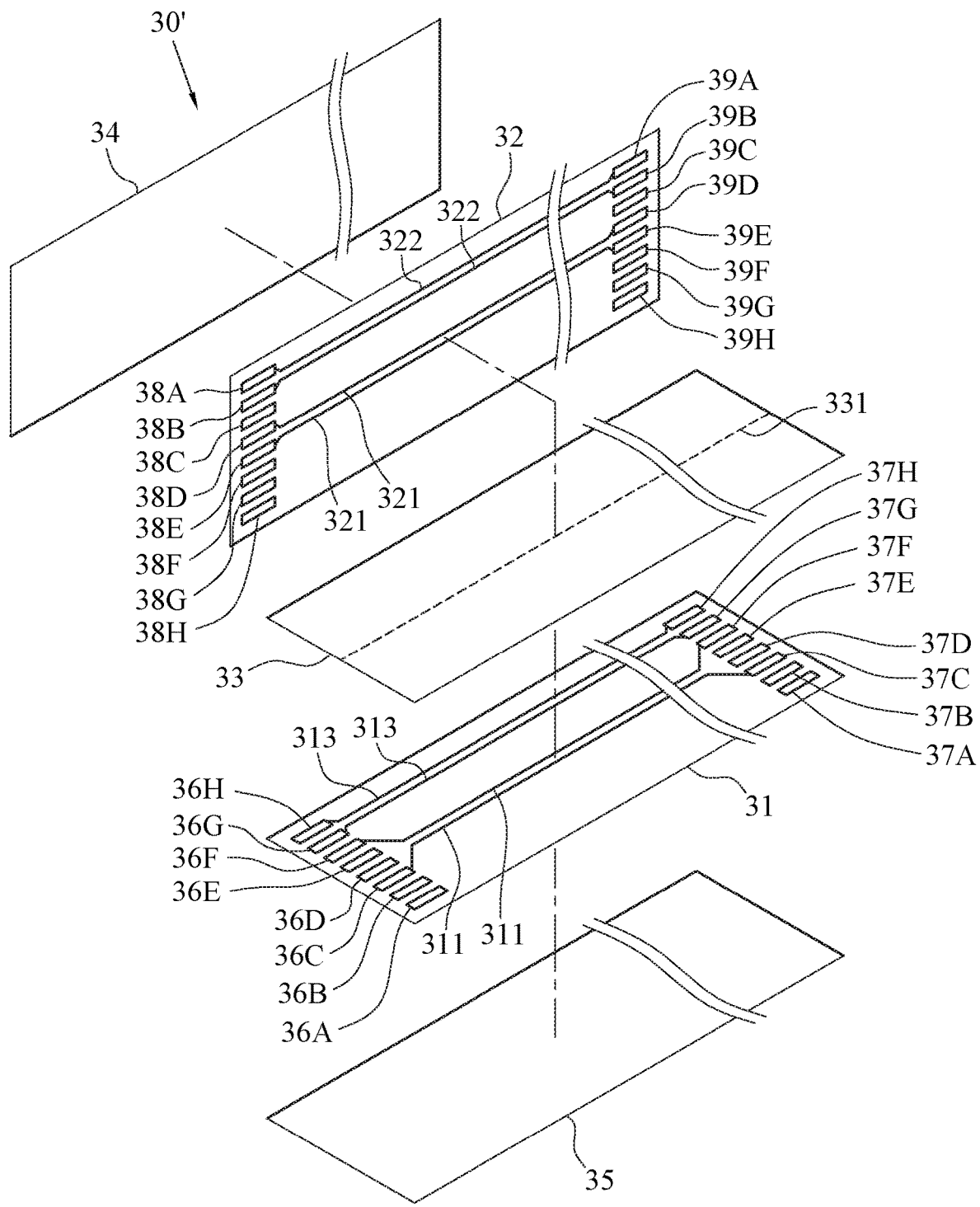
FIG. 4 illustrates a three-dimensional exploded view of another embodiment of an Ethernet transmission line of the instant disclosure.

In some embodiments, both the two third transmission lines 322 and the two fourth transmission lines 323 may be disposed on the first flexible printed circuit board layer 31; or one of the two third transmission lines 322 and the two fourth transmission lines 323 are disposed on the first flexible printed circuit board layer 31, and the other are disposed on the second flexible printed circuit board layer 32. For example, as shown in FIG. 4, FIG. 4 is a three-dimensional exploded view of another embodiment of an Ethernet transmission line of the instant disclosure. A difference between this embodiment and the embodiment in FIG. 3 lies in that two fourth transmission lines 313 of a thin connection line 30' are disposed on the surface of the first flexible printed circuit board layer 31 instead. Ends of the two fourth transmission lines 313 may be respectively electrically connected to electrical contacts 36G, 36H, and the other ends of the two fourth transmission lines 313 may be respectively electrically connected to electrical contacts 37G, 37H, to be respectively electrically connected, via the electrical contacts 36G, 36H and the electrical contacts 37G, 37H, to the seventh terminals 17, 27 and the eighth terminals 18, 28 that correspond to the connection terminal groups 10, 20.

In this way, according to the Ethernet transmission line 100 in this embodiment of the instant disclosure, the thin connection line 30 between the first RJ45 connector 1 and the second RJ45 connector 2 is implemented by a multilayer thin film, so that the thin connection line 30 can be more flat and thin, flexible, and easy to install. For example, a thickness of each of the first flexible printed circuit board layer 31, the second flexible printed circuit board layer 32, and the spacing layer 33 may be between 0.06 mm and 0.2 mm, and an overall thickness of the thin connection line 30 may be reduced to 0.6 mm or less. Therefore, the Ethernet transmission line 100 can easily pass through a gap or be installed at a narrow location when being used for indoor connection. When being used for connection to an outdoor device, the Ethernet transmission line 100 can pass through doors or windows directly without affecting opening and closing of the doors or the windows, thereby reducing costs and maintaining aesthetics of interior decoration without additional construction (for example, damaging the doors or the windows or drilling holes on walls).

Figure 5:
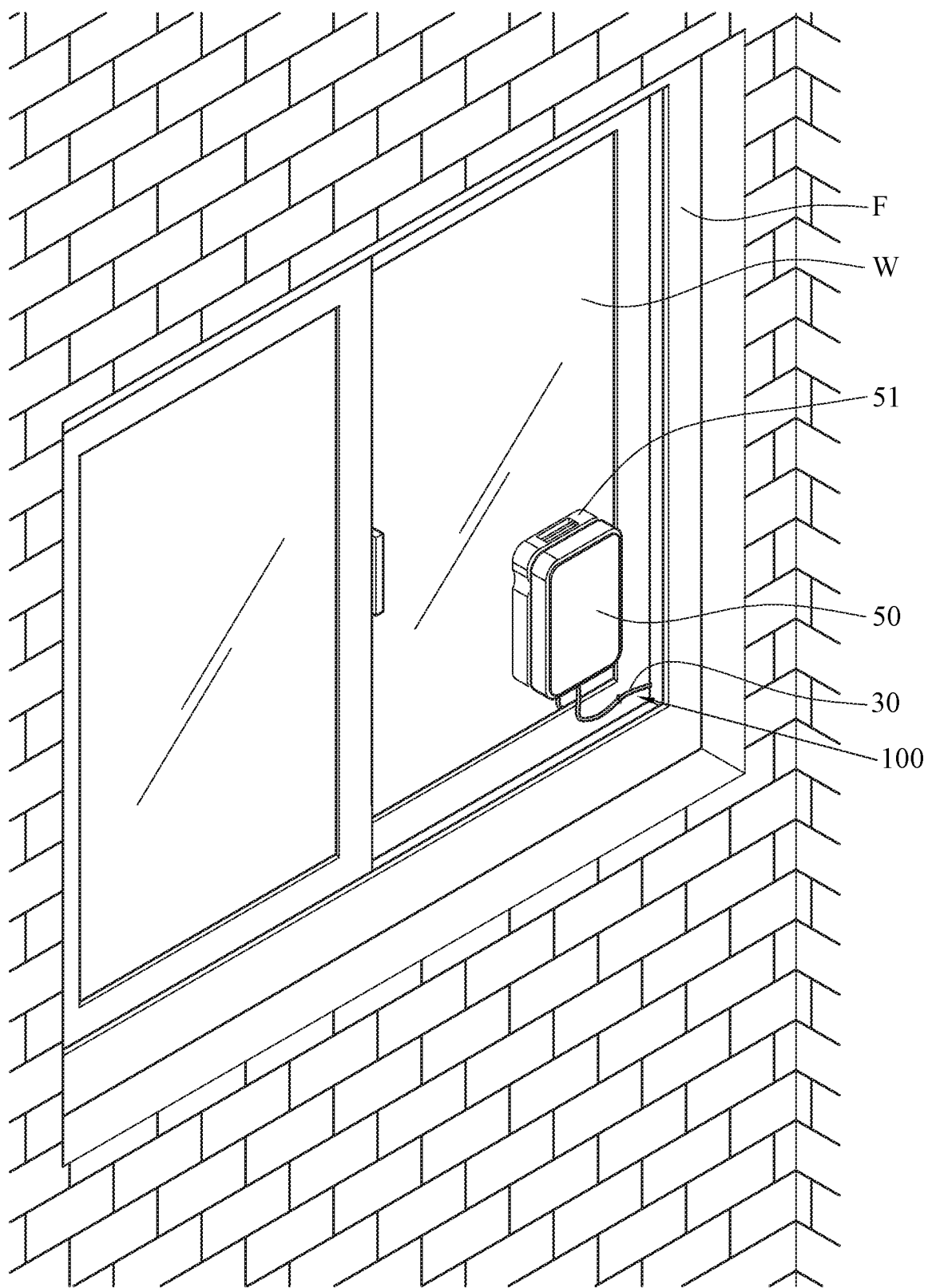
FIG. 5 illustrates a schematic diagram of application of an embodiment of an Ethernet transmission line of the instant disclosure.
Figure 6:
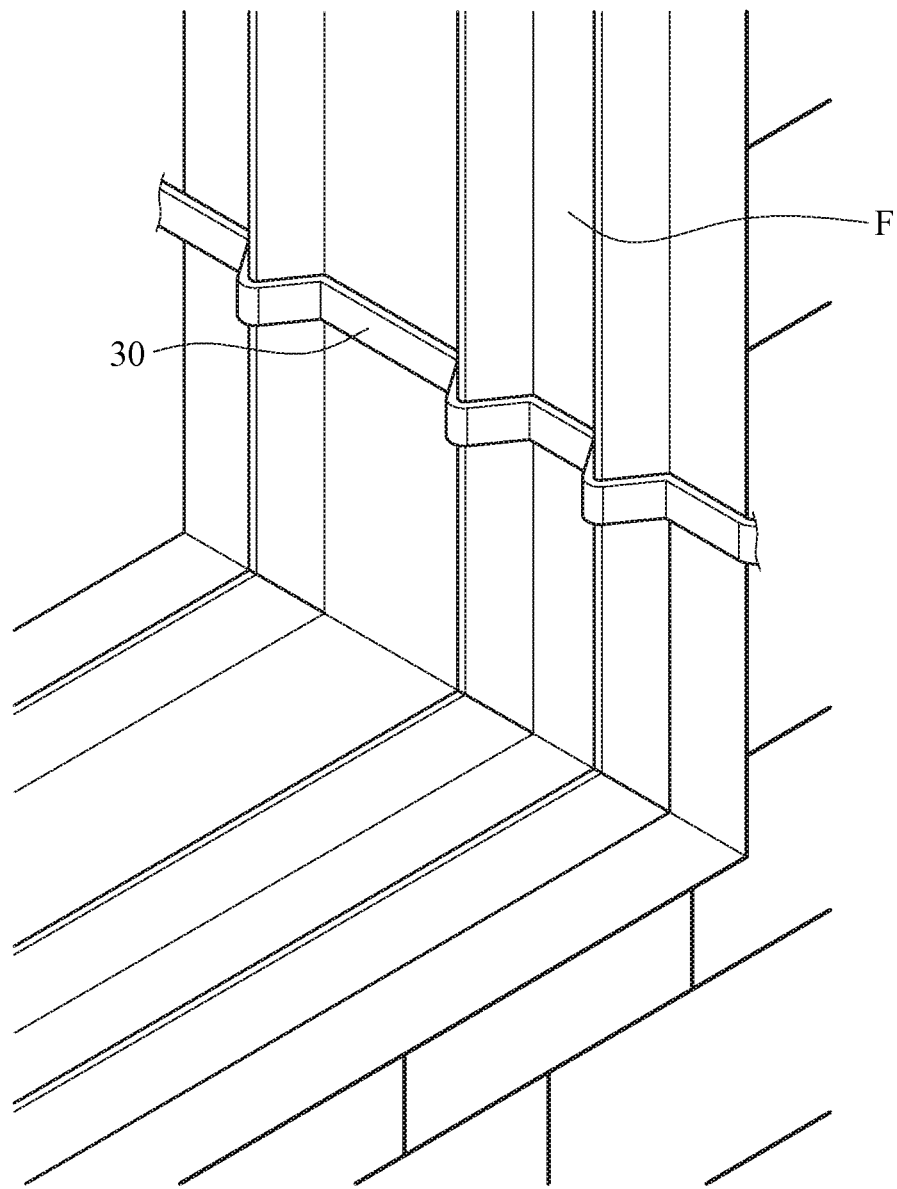
FIG. 6 illustrates a schematic diagram of line installation of an embodiment of an Ethernet transmission line of the instant disclosure.
Figure 7:
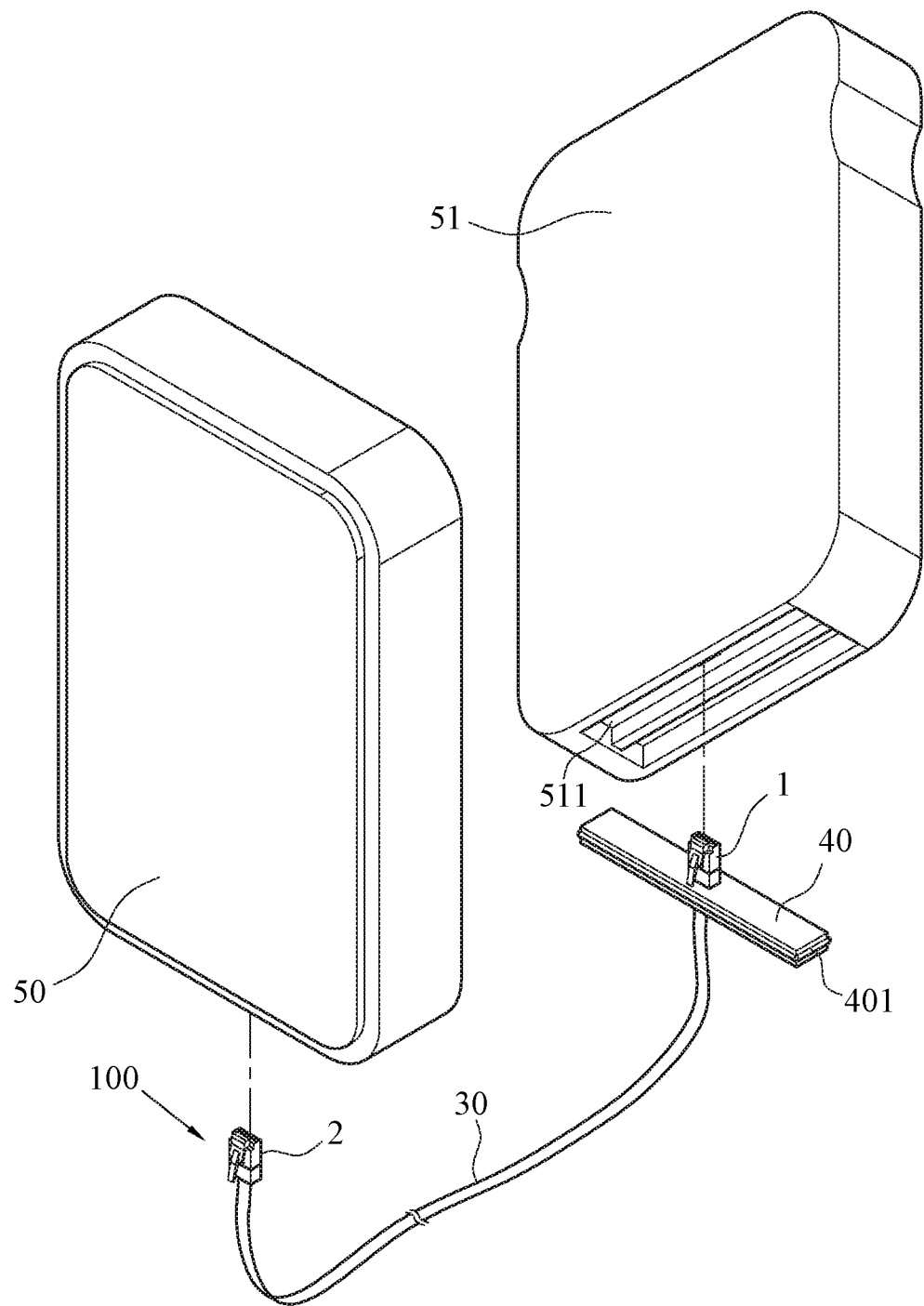
FIG. 7 illustrates a three-dimensional view of another embodiment of an Ethernet transmission line of the instant disclosure.

For example, as shown in FIG. 5 to FIG. 7, the first RJ45 connector 1 and the second RJ45 connector 2 of the Ethernet transmission line 100 may be respectively an outdoor connector and an indoor connector. For example, in this embodiment, the second RJ45 connector 2 is connected to an indoor device 50. For example, the indoor device 50 may be a DSL modem, a gateway, or a router. The first RJ45 connector 1 may be directly connected to an outdoor device 51 by passing through a window W. For example, the outdoor device 51 may be a wireless network transceiver (such as a 5G transceiver or a Wi-Fi transceiver). Because the thin connection line 30 is very thin and flexible, the thin connection line 30 can be easily disposed along an F-shaped window frame of the window W (as shown in FIG. 6), so that after being closed, the window W can still be sealed without affecting an original function of the window W.

In addition, according to the thin connection line 30 in this embodiment of the instant disclosure, the two first transmission lines 311 electrically connected to the third terminals 13, 23 and the sixth terminals 16, 26 in the connection terminal groups 10, 20 are disposed on the first flexible printed circuit board layer 31, and the two second transmission lines 321 electrically connected to the fourth terminals 14, 24 and the fifth terminals 15, 25 in the connection terminal groups 10, 20 are disposed on the second flexible printed circuit board layer 32, so that the two first transmission lines 311 and the two second transmission lines 321 are prevented from being at a same layer to be too close to each other, and can be further separated by the spacing layer 33, thereby greatly reducing crosstalk between each other. In addition, in comparison to a traditional twisted pair cable, for the thin connection line 30 in this embodiment of the instant disclosure, it is easier to control a same length for all transmission lines (the two first transmission lines 311, the two second transmission lines 321, the two third transmission lines 322, and the two fourth transmission lines 323), thereby reducing a transmission delay.

Then, as shown in FIG. 7, the thin connection line 30 of the Ethernet transmission line 100 is provided with a waterproof cover 40. The waterproof cover 40 is adjacent to the first RJ45 connector 1 or the second RJ45 connector 2. In this embodiment, the waterproof cover plate 40 may be adjacent to an outdoor connector (herein, the first RJ45 connector 1). When the first RJ45 connector 1 is connected to the outdoor device 51, the waterproof cover 40 may cover an assembling groove 511 of the outdoor device 51, so that the first RJ45 connector 1 can be enclosed in the assembling groove 511, thereby achieving a waterproof effect. In one embodiment, a circumference of the waterproof cover 40 may be further provided with a sealing ring 401 (for example, a silicone ring or a rubber ring) to enhance a waterproof effect.

As shown in FIG. 3, in an embodiment, the spacing layer 33 of the thin connection line 30 is further provided with a ground line 331, and the ground line 331 may be located between the two second transmission lines 321 and the two first transmission lines 311 to further prevent crosstalk between the two second transmission lines 321 and the two first transmission lines 311.

Then, as shown in FIG. 3, in this embodiment, the thin connection line 30 further includes two protective layers 34, 35. Each of the two protective layers 34, 35 covers an exterior of the first flexible printed circuit board layer 31 or the second flexible printed circuit board layer 32 (herein, covers surfaces that are of the first flexible printed circuit board layer 31 and the second flexible printed circuit board layer 32 and that are far away from the spacing layer 33) to achieve a protective effect. For example, the protective layers 34, 35 may be waterproof layers, for example, rubber layers or coating layers made of waterproof materials, so that the thin connection line 30 can have a waterproof effect and facilitate connection to various outdoor devices.

In some embodiments, the protective layers 34, 35 may be alternatively electromagnetic wave shield layers. For example, the protective layers 34, 35 may be single-layer or multi-layer conductive metal (for example, silver, copper, or nickel) thin films formed through vacuum sputtering or chemical plating, so that the thin connection line 30 has an electromagnetic wave shielding capability. In one embodiment, thicknesses of the protective layers 34, 35 may be controlled between 0.1 μm and 1 to maintain good flexibility of the thin connection line 30.

Although the instant disclosure has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An Ethernet transmission line, comprising:
   two RJ45 connectors, each RJ45 connector having a connection terminal group comprising a first terminal, a second terminal, a third terminal, a fourth terminal, a fifth terminal, a sixth terminal, a seventh terminal, and an eighth terminal that are sequentially arranged, wherein the first terminal and the second terminal are a first pair of differential terminals, the third terminal and the sixth terminal are a second pair of differential terminals, the fourth terminal and the fifth terminal are a third pair of differential terminals, and the seventh terminal and the eighth terminal are a fourth pair of differential terminals; and
   a thin connection line connected between the two RJ45 connectors, the thin connection line comprising a first flexible printed circuit board layer, a second flexible printed circuit board layer, and a spacing layer, wherein the spacing layer is sandwiched between the first flexible printed circuit board layer and the second flexible printed circuit board layer; the first flexible printed circuit board layer is provided with two first transmission lines, the two first transmission lines being respectively electrically connected to the third terminal and the sixth terminal that correspond to each connection terminal group; and the second flexible printed circuit board layer is provided with two second transmission lines, the two second transmission lines being respectively electrically connected to the fourth terminal and the fifth terminal that correspond to each connection terminal group.

2. The Ethernet transmission line according to claim 1, further comprising two third transmission lines disposed on the first flexible printed circuit board layer or the second flexible printed circuit board layer and respectively electrically connected to the first terminal and the second terminal that correspond to each connection terminal group.

3. The Ethernet transmission line according to claim 1, further comprising two fourth transmission lines disposed on the first flexible printed circuit board layer or the second flexible printed circuit board layer and respectively electrically connected to the seventh terminal and the eighth terminal that correspond to each connection terminal group.

4. The Ethernet transmission line according to claim 1, wherein the thin connection line further comprises a protective layer covering at least an exterior of the first flexible printed circuit board layer or the second flexible printed circuit board layer.

5. The Ethernet transmission line according to claim 4, wherein the protective layer is a waterproof layer.

6. The Ethernet transmission line according to claim 4, wherein the protective layer is an electromagnetic wave shield layer.

7. The Ethernet transmission line according to claim 1, wherein the two first transmission lines are disposed on an inner surface of the first flexible printed circuit board layer and the two second transmission lines are disposed on an inner surface of the second flexible printed circuit board layer.

8. The Ethernet transmission line according to claim 1, wherein the spacing layer of the thin connection line is provided with a ground line.

9. The Ethernet transmission line according to claim 1, wherein the two RJ45 connectors are respectively an outdoor connector and an indoor connector.

10. The Ethernet transmission line according to claim 9, wherein the thin connection line is further provided with a waterproof cover adjacent to the outdoor connector.

* * * * *